Figure 1:
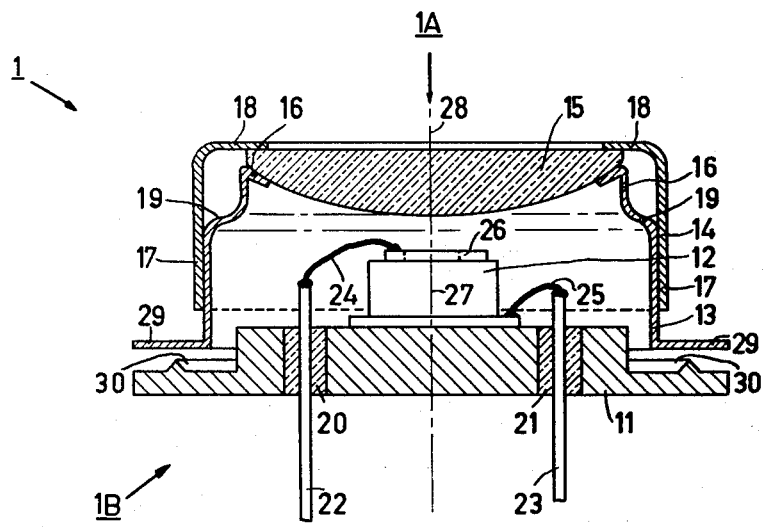

United States Patent [19]

Khoe et al.

[11] 4,295,152
[45] Oct. 13, 1981

[54] OPTICAL COUPLER WITH A HOUSING PERMITTING ADJUSTMENT OF THE DISTANCE BETWEEN THE LIGHT SOURCE AND THE LENS

[75] Inventors: Giok D. Khoe; Hendrikus G. Kock; Lambertus J. Meuleman; Lodewijk J. Van Ruyven, all of Eindhoven, Netherlands

[73] Assignee: U.S. Philips Corporation, New York, N.Y.

[21] Appl. No.: 44,611

[22] Filed: Jun. 1, 1979

[30] Foreign Application Priority Data

Jun. 19, 1978 [NL] Netherlands ............... 7806569

[51] Int. Cl.³ .................. H01L 23/12; H01L 23/02; H01L 27/14
[52] U.S. Cl. ......................... 357/74; 357/17; 357/30; 357/81; 350/96.21
[58] Field of Search .......... 357/17, 74, 81, 30; 350/96.2, 96.21, 96.22

[56] References Cited

U.S. PATENT DOCUMENTS

| | | | |
|---|---|---|---|
| 2,640,901 | 6/1953 | Kinman | 357/74 |
| 3,816,847 | 6/1974 | Nagao | 357/81 |
| 3,946,416 | 3/1976 | Hacskaylo | 357/17 |
| 4,119,363 | 10/1978 | Camlibel et al. | 350/96.2 |
| 4,144,541 | 3/1979 | Schaefer | 357/17 |
| 4,166,668 | 9/1979 | MacLeod | 350/96.21 |
| 4,168,883 | 9/1979 | MacLeod | 350/96.21 |
| 4,182,545 | 1/1980 | Greer | 350/96.2 |

*Primary Examiner*—Andrew J. James
*Attorney, Agent, or Firm*—Thomas A. Briody; William J. Streeter; Algy Tamoshunas

[57] ABSTRACT

In optical communication systems as well as in video disc playback equipment, it is necessary to position a light source such as a semiconductor laser at an exact distance from a lens of the optical system. In accordance with the invention this is done by mounting the laser in a tubular cover which is in a telescopic, press fit engagement with a holder provided with the lens. The desired exact distance between the laser and the lens is adjusted by relative compression between the cover and the holder. Because the engaging walls of the cover and holder are covered with a layer of indium, the walls will slide smoothly over each other during adjustment of the desired distance.

8 Claims, 3 Drawing Figures

OPTICAL COUPLER WITH A HOUSING PERMITTING ADJUSTMENT OF THE DISTANCE BETWEEN THE LIGHT SOURCE AND THE LENS

The invention relates to an optical coupling element, comprising a light source and a lens, the light source being mounted on a support on which a cylindrical cover is arranged, the lens being situated opposite the light source, a light beam therefrom being directed around a central axis of the cover.

A coupling element of this kind is described in a publication by Masayuki Abe in I.E.E.E. Transactions on Electron Devices, Vol. ED-24, No. 7, July 1977, pages 990–994. The described coupling element comprises a light-emitting diode, but could alternatively comprise a semiconductor laser. Furthermore, the lens is formed at an end of an optical fibre into which the light emitted by the diode is radiated via the lens. The coupling element shown is used in an optical communication system in which data transmission is realized by means of light pulses to be transmitted via optical fibres. However, the coupling element may also comprise only one or a few lenses. A coupling element of this kind can also be used, for example, in a video disk reading device where the data recorded on a disk are read by optical means. The optical means comprise at least said light source, the lens, a reflective surface of the video disk, and a light detector. In order to maximize light transmission from the light source to the optical element situated behind the lens, the axis of the lens should occupy the correct transverse position relative to the light source and the lens should be situated at the correct distance from the light source. The method of adjusting the transverse position and the distance between two optical elements is partly disclosed already in said publication, and is fully disclosed in the U.S. Pat. No. 3,999,841.

The object of the present invention is to provide a coupling element which not only enables very accurate transverse positioning of the light source with respect to the lens axis, but also permits simple and quick adjustment of the distance between the light source and the lens, both adjustments being maintained without the need for adhesives such as epoxy resins.

To this end, the invention provides an optical coupling element, comprising a light source and a lens. The light source is mounted on a support on which a cylindrical tubular member cover is arranged and the lens is situated opposite the light source in a holder with a light beam from the source being directed around the cylinder axis of the cover. In accordance with the invention, the holder forms a press fit with the cover and, together with the cover and the support, forms a hermetically sealed space. The holder enables the distance between the lens and the light source to be adjusted and for this purpose is arranged to be displaceable relative to the cover parallel to the cylinder axis.

The distance between the light source and the lens is simply adjusted in the coupling element in accordance with the invention by pressing the holder, and hence the lens, towards the light source during which the light beam generated by the light source and emerging via the lens is continuously observed and/or the energy content thereof is continuously measured.

In a preferred embodiment of the coupling element in accordance with the invention, the cover, as well as the holder, is shaped as a bush and each is provided with a collar, the collar of the cover being secured to the support and the lens being secured to the collar of the holder. The collar on which the lens is mounted may be formed in the holder which is provided, on an edge which is remote from the cover, with centring means for centring an optical element, to be mounted on the holder, with respect to an optical axis of the lens mounted in the holder, fixing means for fixing the optical element to be mounted on the holder being provided on the exterior of the holder.

One advantage of such a coupling element is that a further optical element can be mounted thereon without further adjusting means being required for centring. The fixing means may be a thread, but may also form part of a bayonet coupling. The centring means may be formed by a conical surface or by a radially directed edge profile, for example a set of teeth.

Figure 2:
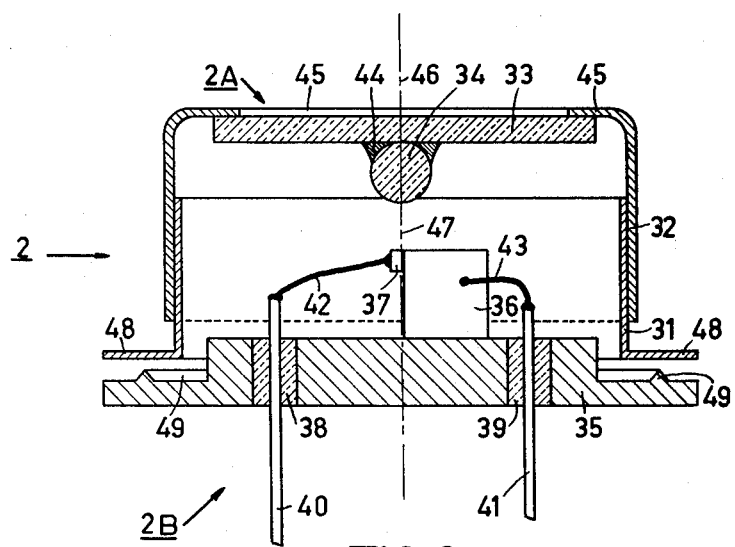
Figure 3:
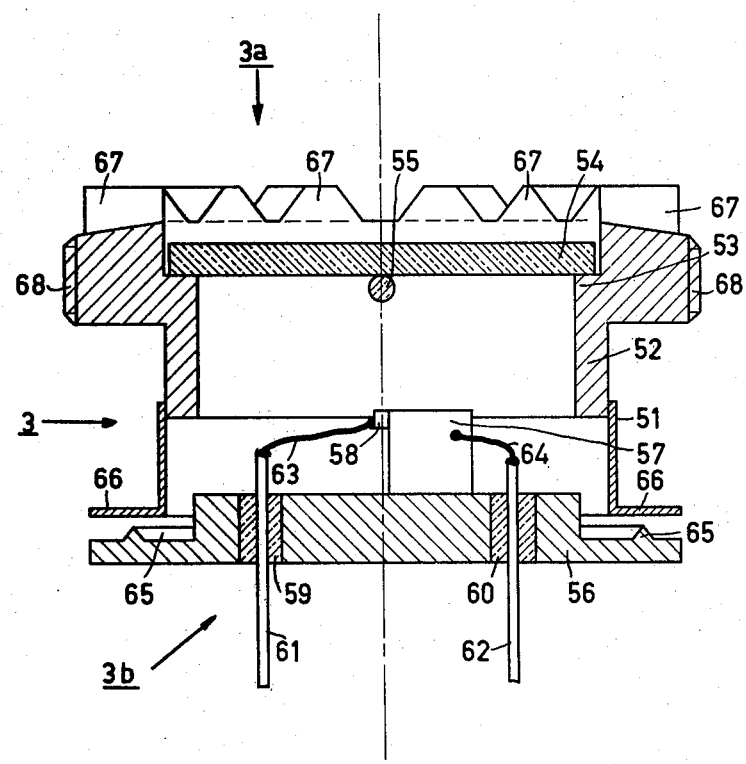

Embodiments of coupling elements in accordance with the invention will be described, by way of example, hereinafter with reference to the accompanying diagrammatic drawings, in which:

FIG. 1 is a sectional view of two parts of a coupling element in accordance with the invention to be assembled, FIG. 2 is a sectional view of two parts of a further embodiment of a coupling element in accordance with the invention to be assembled, and FIG. 3 is a sectional view of two parts of a preferred embodiment in accordance with the invention to be assembled.

The coupling element 1 of FIG. 1, shown in two parts 1A, 1B, comprises a metal support 11 on which is mounted a light-emitting diode 12, a metal cover 13, a metal holder 14, and a glass lens 15. The cover 13, the holder 14, and the lens 15 together form a first part A, and the support 11 with the diode 12 form a second part B of the coupling element 1. The lens 15 is secured to an elastic edge 16 of the cover 13 by way of a known metal-to-glass bond. By way of a sleeve end 17, the holder 14 forms a press fit with the cover 13 and a collar 18 on holder 14 bears against the lens 15. It has been found to be advantageous to provide at least the cover with a layer of indium in order to enable smooth adjustment of the desired distance. Between the press fit with the end 17 of the holder 14 and the edge 16, the cover 13 comprises an annular collapse zone 19, the function of which will be described hereinafter.

Two glass-filled passages 20 and 21 accommodate pins 22 and 23 to which are connected the power supply leads 24 and 25 for the diode 12. Passages of this kind are well known from the technique used for the manufacture of metal envelopes for semiconductor transistors and circuits. The power supply lead 24 is connected to an annular electrode 26 which encloses the light-emitting surface of the diode 12. A central axis 27 which indicates the centre of the light beam to be emitted is directed onto the light-emitting surface. The optical axis 28 of the lens 15 should coincide with the central axis 27 in order to ensure optimum transmission of light from the diode 12 to an optical element (not shown) which is to be arranged behind the lens 15. The first part 1A (the cover 13, the holder 14 and the lens 15) is placed in the correct transverse position with respect to the second part 1B (the support 11 and the diode 12) in a known manner which is disclosed in said publication. Subsequently, the first part is welded, by way of a collar 29 formed on the cover 14, to a ridge 30 formed on the support 11 by circumferential welding (resistance welding, using pressure and high voltage). The lens 15 is then moved axially towards the diode 12 until it is situated at the correct distance therefrom by pressing the holder 14 towards the support 11. The distance between the lens 15 and the diode 12 can be accurately adjusted by continuously or periodically observing the light-beam passing through the lens 15 during the movement of the lens 15 towards the diode 12.

During the pressing of the holder 14 towards the support 11, the collapse zone 19 of the cover 14 is deformed. As a result of the inherent elastic deformation, the lens 15 remains pressed against the collar 18 of the holder 14 which forms, as mentioned above, a press fit with the cover 13. As a result of the press fit, once the distance between the diode 12 and the lens 15 has been adjusted, it will not be affected by elastic recovery of the edge 16 due to the elastic deformation of the collapse zone 19.

FIG. 2 shows two parts 2A, 2B of a further embodiment of a coupling element 2. The first part 2A comprises a cover 31, a holder 32, a plane-parallel glass plate 33, and a ball-lens 34 glued thereon. The second part 2B comprises a support 35, a laser diode 37 mounted on a cooling block 36, and two connection pins 40 and 41 which are arranged in glass-filled passages 38 and 39 and which are connected to the laser diode 37 and the cooling block 36, respectively, via connection wires 42, 43, respectively.

The lens 34 is glued to the glass plate 33 by means of an adhesive 44, for example, a setting epoxy resin, said plate in its turn being connected, by way of a known metal-to-glass bond, to a collar 45 formed on the holder 32. The optical axis 46 of the lens 34 should coincide with a central axis 47 which passes through the active zone of the laser diode 37, for the reasons already described with reference to FIG. 1. The part 2A of the coupling element 2 is arranged in the correct transverse position with respect to the cooling block 36 mounted on the support 35 in the described manner, after which a collar 48 of the cover 31 is welded to a ridge 49 formed on the support 35.

When the holder 32 is subsequently pressed towards the support 35, the lens 34 is moved towards the laser diode 36 and the desired distance between these two elements is adjusted, the press fit formed by the cover 31 and the holder 32 maintaining the adjusted distance. Preferably, the cover 31 and the holder 32 are covered with indium, so that the desired distance can be readily adjusted. The reaching of the desired distance can be established in the same manner as already described with reference to FIG. 1.

FIG. 3 shows two parts 3a, 3b of a preferred embodiment of a coupling element 3 in accordance with the invention. The first part 3a comprises a circular, cylindrical metal cover 51 and a circle-cylindrical metal holder 52, in which a plane-parallel glass plate 54 is secured on a shoulder 53 in known manner. A ball-lens 55 is welded to the glass plate 54. This can be realised by using a soft glass plate 54 which has a lower melting temperature than a hard glass used to manufacture the lens 55. The second part 3b comprises a metal support 56 on which a laser diode 58 mounted on a cooling block 57 is arranged. The support 56 comprises two glass-filled passages 59 and 60 in which two connection pins 61 and 62 are arranged. Connection wires 63 and 64, being connected to the laser diode 58 and the cooling block 57, respectively, are connected to the connection pins 61 and 62, respectively. Like the supports 11 and 35 of the FIGS. 1 and 2, respectively, the support 56 comprises a ridge 65 whereto a collar 66 of the cover 51 is welded, after the first part 3a has been correctly positioned transversely with respect to the second part 3b in the described manner. Subsequently, the holder 52 is pressed towards the support 56 for adjustment of the correct distance between the laser diode 58 and the lens 55. The walls of the cover 51 and the holder 52, forming the press fit, are covered with indium or another soft metal. The holder 52 forms a press fit with the cover 51, so that the adjusted distance is maintained. A circular cylindrical edge which is provided with a profile of radially directed teeth 67 is formed on the holder 52. The holder 52 is furthermore provided with an external thread 68, so that a further optical element can be secured on the coupling element. The profiled edge cooperates with a further optical element, for example, one half of an optical fibre connector for optical communication purposes which also comprises a profiled edge. This profile is then made complementary to the teeth 67 of the edge of the holder 52. The optical element will thus be exactly positioned. Before the holder 52 is secured in the cover 51, the lens 55 and the glass plate 54 are secured in the holder 52 in the described manner by way of a metal-to-glass bond, so that the optical axis 69 of the lens 55 coincides with the symmetry axis of the edge of the holder 52. As a result, an optical element arranged on the holder 52 is always centred with respect to the lens 55 and also with respect to the laser diode 58.

What is claimed is:

1. An optical coupler comprising a support, a light source for emitting a beam of light mounted on said support, a tubular member affixed to said support, said tubular member being disposed about said source such that the longitudinal axis of said tubular member is generally coaxial with the axis of said beam so that said beam passes through said tubular member along the axis thereof, a holder having a cylindrical portion and a hole formed therethrough, said hole extending along the longitudinal axis of said cylindrical portion, a lens, means for supporting said lens on said holder adjacent one end of said cylindrical portion so that said lens is centered about the longitudinal axis of said hole, the end portion of said cylindrical portion opposite said one end being in telescoping engagement with said tubular member so that said axis of said cylindrical portion is coaxial with the axis of said tubular member and so that said holder and said lens supported thereon is displaceable relative to said tubular member and said support in a direction parallel to the longitudinal axes thereof thereby enabling the distance between said light source and said lens to be adjusted while maintaining the axis of said beam aligned with the center of said lens.

2. The coupler according the claim 1 wherein said holder with said lens supported thereon, said tubular member and said support define a hermetically sealed space about said light source.

3. The coupler according to claim 1 or 2 wherein said portions of said tubular member and said holder in telescoping engagement with each other are configured to form a press fit so that the desired distance between said lens and said source is maintained after displacement of said holder relative to said support.

4. The coupler according to claim 3 including a layer of indium on the portion of the surface of at least one of said cylindrical portion and said tubular member which is in said telescoping engagement with the other.

5. The coupler according to claim 3 wherein said tubular member has an outwardly extending flange on the end thereof adjacent said support, said flange being attached to said support.

6. The coupler according to claim 1 wherein said cylindrical portion of said holder is disposed about said tubular member and the end portion of said tubular member adjacent said lens is deformable, in engagement with the peripheral portion of said lens and configured so that said end portion of said member is deformed upon displacement of said holder towards said support.

7. The coupler according to claim 1 including means for attaching an optical element to the end of said holder adjacent said lens so that the element is centered with respect to the center of said lens.

8. The coupler according to claim 7 wherein the end of said holder adjacent said lens has a flange with a plurality of teeth formed thereon adapted to engage mating teeth on the optical element and center the element with respect to said lens.

* * * * *